United States Patent
Dolechek et al.

(10) Patent No.: US 6,895,981 B2
(45) Date of Patent: May 24, 2005

(54) CROSS FLOW PROCESSOR

(75) Inventors: Kert Dolechek, Kalispell, MT (US); Jeffry Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 24 days.

(21) Appl. No.: 10/200,073

(22) Filed: Jul. 19, 2002

(65) Prior Publication Data

US 2004/0010930 A1 Jan. 22, 2004

(51) Int. Cl.[7] .............................................. B08B 3/00
(52) U.S. Cl. ..................... 134/148; 134/157; 134/153; 134/102.3; 134/95.2
(58) Field of Search .............................. 34/58, 59, 72, 34/79–84, 107, 202, 317, 312; 134/25.4, 157, 148, 30, 902, 102.3, 95.2, 153

(56) References Cited

U.S. PATENT DOCUMENTS

| | | | | |
|---|---|---|---|---|
| 1,887,873 A | * | 11/1932 | Hagen | 415/151 |
| 4,841,645 A | * | 6/1989 | Bettcher et al. | 34/78 |
| 5,083,381 A | * | 1/1992 | Aigo | 34/317 |
| 5,174,045 A | * | 12/1992 | Thompson et al. | 34/58 |
| 5,562,113 A | * | 10/1996 | Thompson et al. | 134/95.2 |
| 5,738,128 A | * | 4/1998 | Thompson et al. | 134/95.2 |
| 5,784,797 A | * | 7/1998 | Curtis et al. | 34/58 |
| 5,954,911 A | * | 9/1999 | Bergman et al. | 156/345.29 |
| 5,972,127 A | * | 10/1999 | Thompson et al. | 134/33 |
| 6,062,239 A | * | 5/2000 | Bexten | 134/25.4 |
| 6,125,863 A | * | 10/2000 | Bexten | 134/95.2 |
| 6,199,298 B1 | * | 3/2001 | Bergman | 34/315 |
| 6,273,110 B1 | * | 8/2001 | Davis et al. | 134/133 |
| 6,370,791 B1 | * | 4/2002 | Weaver et al. | 34/58 |

* cited by examiner

Primary Examiner—Henry Bennett
Assistant Examiner—Camtu Nguyen
(74) Attorney, Agent, or Firm—Perkins Coie LLP

(57) ABSTRACT

A centrifugal processor includes an elongated inlet and outlet in fluid communication with a rotor housing having an eccentric bowl. A rotor having fan blades and adapted to hold flat media is rotatably disposed within the rotor housing. An intake gate is pivotally mounted to the rotor housing to swing about the rotor into a closed position during a rinse mode and into an open position during a drying mode. The gate has a wedge that is designed to almost contact the rotor when the gate is in the open position for drying. The geometry of the elongated inlet, outlet, and eccentric bowl, in combination with the design of the rotor and that of the intake gate, work together to create a cross flow fan having a flow path across the flat media and one that exposes the flat media to large volumes of incoming air only once.

32 Claims, 9 Drawing Sheets

44

US 6,895,981 B2

CROSS FLOW PROCESSOR

BACKGROUND OF THE INVENTION

The field of the invention is centrifugal processors used in manufacturing flat media products.

The production of semiconductor wafers, substrates and photomask plates used in the manufacture of semiconductor wafers, has typically used processing equipment in which various types of processing fluids are used to treat the wafers. One example of a semiconductor processor is a centrifugal rinser-dryer used to rinse acids, caustics, etchants and other processing fluids from wafers, photomask plates, and similar units. The rinser-dryers are also used to dry the rinsed units using a flow of heated gas, such as nitrogen, which is passed through the processing chamber after rinsing with the desired fluid. The wafers are spun during processing to provide more even distribution of the processing fluids across the wafer surfaces and to assist in removal of rinsing liquids in preparation for drying.

Other types of semiconductor processors include acid and caustic treatment machines that spray or otherwise apply acids and caustics to the wafers or other flat media. Stripping processors are used to remove photoresist from the wafers. Other specific processing of wafers may require other types of chemicals. Many of these processes are appropriately performed in centrifugal processing machines to provide for even distribution of fluids over the wafer and to aid in removal of liquids.

A primary problem in the manufacturing semiconductor wafers is particle contamination. Contaminant particles can affect the photographic processes used to transfer the chip layouts onto the wafers being processed into chips. Contaminants on the photomasks can cause deterioration of the image being transferred onto the wafer. The direct processing of the wafers or other flat media themselves is even more susceptible to contamination because of the numerous processing steps, and the risk at each stage that contaminating particles can become adhered to the surface of the wafer. Particle contamination typically causes a large number of the devices on a wafer to be defective. Thus it is very important to reduce contamination to increase yields.

The costs of building and operating a modern semiconductor device manufacturing or fabrication facility now can often approach or exceed one billion dollars. Consequently, the amount of defect-free devices produced per hour/day/week is critical. As a result, there is a constant need to speed up the manufacturing processes. The centrifugal rinser-dryers described above are often used to rinse and dry wafers between various manufacturing steps. The drying process performed by current centrifugal rinser-dryers takes about 6–7 minutes. While centrifugal rinser-dryers have performed well in the past, faster drying is still needed. Many centrifugal rinser-dryers also use a purified gas, such as nitrogen, for drying, which adds to the manufacturing cost of the semiconductor devices.

It is therefore an object of the invention to provide an improved centrifugal rinser-dryer providing much faster drying.

It is also an object of the invention to provide very fast, yet low cost, drying methods.

SUMMARY OF THE INVENTION

In a first aspect, a centrifugal processor is designed to quickly remove fluid droplets from all areas of the wafers. A rotor within a rotor-housing has fan blades and adapted to hold wafers is rotatably supported within an eccentric bowl. This helps to create an air flow path wherein a large volume of air is rapidly moved through the processor, to quickly dry the wafers. The wafers in general are advantageously exposed to the same air flow only once. An elongated air inlet and an elongated air outlet may be used to help establish the air flow path.

In a second separate aspect of the invention, an intake gate is provided in the rotor housing. The intake gate is moveable into a closed position during a rinse mode and into an open position during a drying mode. This helps to direct or confine air flow (and/or liquids) through the housing to the desired path or location.

In a third separate aspect of the invention, the gate has a wedge positioned adjacent to the rotor when the gate is in the open position for drying, to help create and direct air flow.

In a fourth separate aspect of the invention, the geometry of the inlet, outlet, and eccentric bowl, in combination with the design of the rotor and the intake gate, create a cross flow fan effect having a flow path across the wafers, exposing them only one time to large volumes of flowing air. Drying times are dramatically reduced, to as low as 30–60 seconds.

In a method for rinsing and drying wafers, the wafers are rotated within a rotor while sprayed with a liquid. A gate is positioned adjacent to isolate flow and movement of air and/or the liquid. During drying, the gate is moved away from the rotor.

Other and further objects, inventive features, and advantages, will appear hereinafter. The invention resides as well in subsystems and subcombinations of the features and steps described. For example, the processor may be set up to perform centrifugal drying, without any rinsing function.

The word "wafer" or "semiconductor wafer" here means a semiconductor wafer or substrate, photomask, memory media, flat panel display as well as various other flat media used in the manufacture of electronic products, whether made of semiconductor or non-semiconductor material. The word "gate" here means a surface which is moveable into one or more alternate positions, to affect air flow.

BRIEF DESCRIPTION OF THE DRAWINGS

The invention will become apparent from the following detailed description and drawings. It should be understood, however, that the drawings are designed for the purpose of illustration only, and are not intended as a definition of the limits of the invention.

In the drawings, wherein the same reference numbers denote the same elements throughout the several views.

DETAILED DESCRIPTION OF PREFERRED EMBODIMENTS

Figure 1:
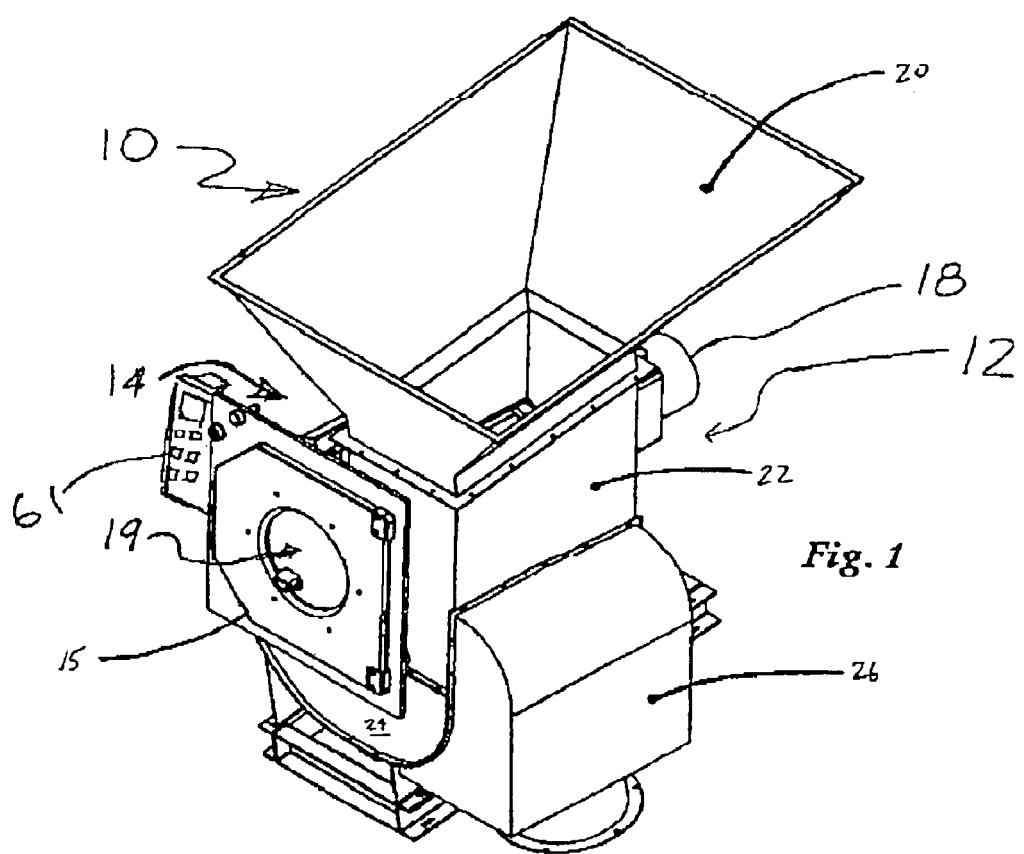
FIG. 1 is a front, top and right side perspective view of the present centrifugal processor.

Turning now in detail to the drawings, as shown in FIG. 1, a centrifugal processor 10 includes a processor housing 12 that contains a rotor housing 14. The rotor housing 14 in turn contains a rotor assembly 16 (shown in FIGS. 4–7) that is designed to hold and spin wafers or other flat media. A drive motor 18 and drive suspension 31, as shown in FIG. 2, are used to rotate or spin the rotor assembly 16.

A door 15 is pivotally or linearly mounted to the front wall of the rotor housing 14 to provide access to the processing chamber 19. Wafers to be processed are placed into the chamber 19 by opening the door 15.

Figure 4:
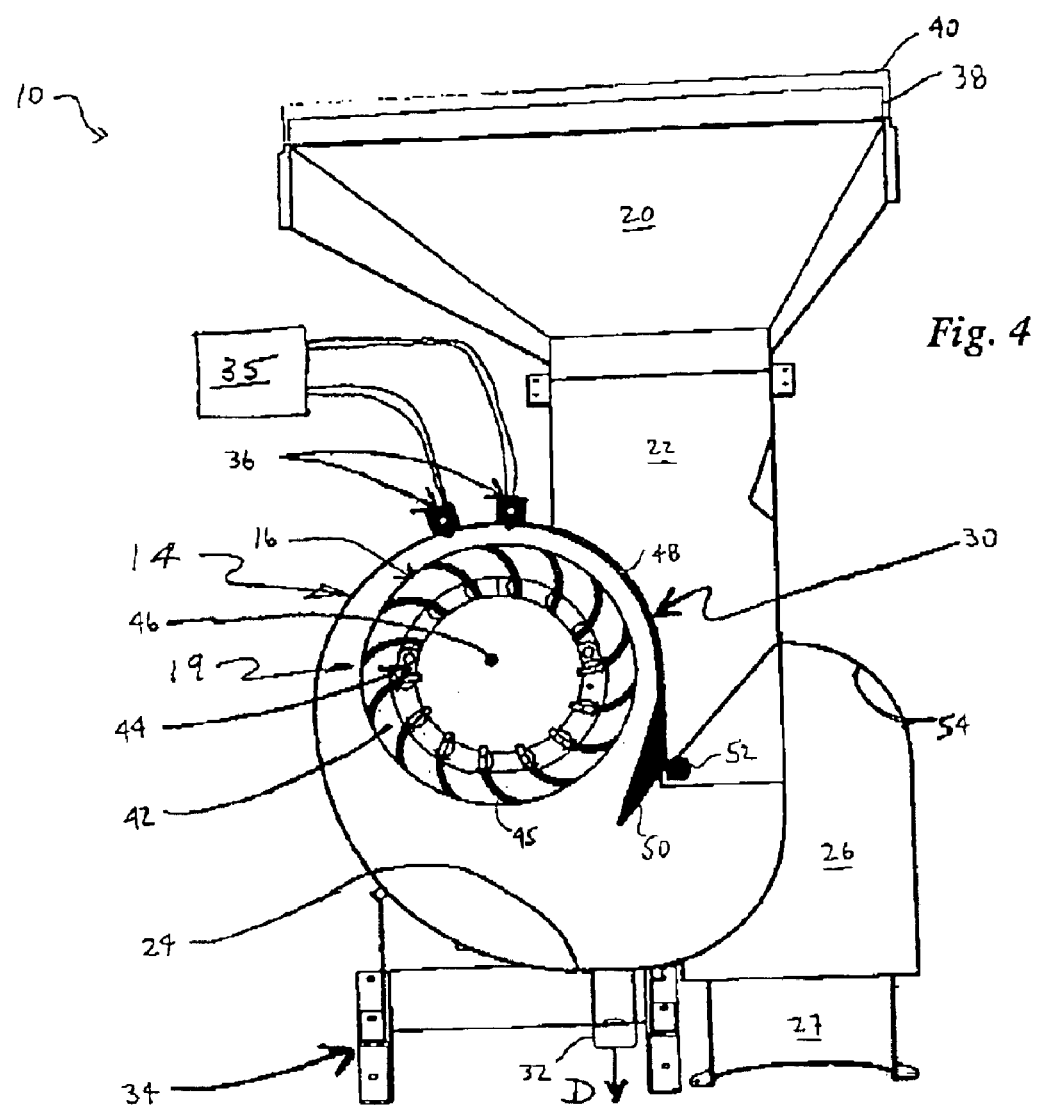
FIG. 4 is a front, partially sectional view of the centrifugal processor shown in FIG. 1 operating in the rinse mode.

Referring to FIG. 4, unlike known centrifugal processors, the present centrifugal processor 10 has a large and non-uniform amount of clearance space between the rotor and the chamber. At the top, the clearance ranges from e.g., 1–4 cm and is nominally about 2.5 cm. At the bottom, the clearance is much greater, ranging from e.g., 12–36, 15–30, or 20–25 cm. Consequently, the clearance at the bottom is generally about 5–15, 8–12, or 8–10 times greater than the clearance at the top. The processor 10 includes a large Inlet 20 in fluid communication with, or connecting Into, the processing chamber 19 at the top or side of the processor housing 12. An intake duct 22 connects the inlet 20 to the rotor housing 14 and in turn the processing chamber 19. The intake duct has a flow cross section which is preferably at least 20%, 30%, 40% or 50% of the cross sectional area of the rotor. In the particular embodiment shown in FIGS. 4–6, the inlet duct flow cross section is 200–600, or 300–500 $cm^2$. The rotor housing 14 includes an eccentric bowl 24 formed at the bottom of the rotor housing 14 and extending to the side of the processor housing 12. An exhaust duct 26 connects directly with the processing chamber 19 and the area defined by the bowl 24. An exhaust outlet 27 connects to the exhaust duct 26.

Figure 2:
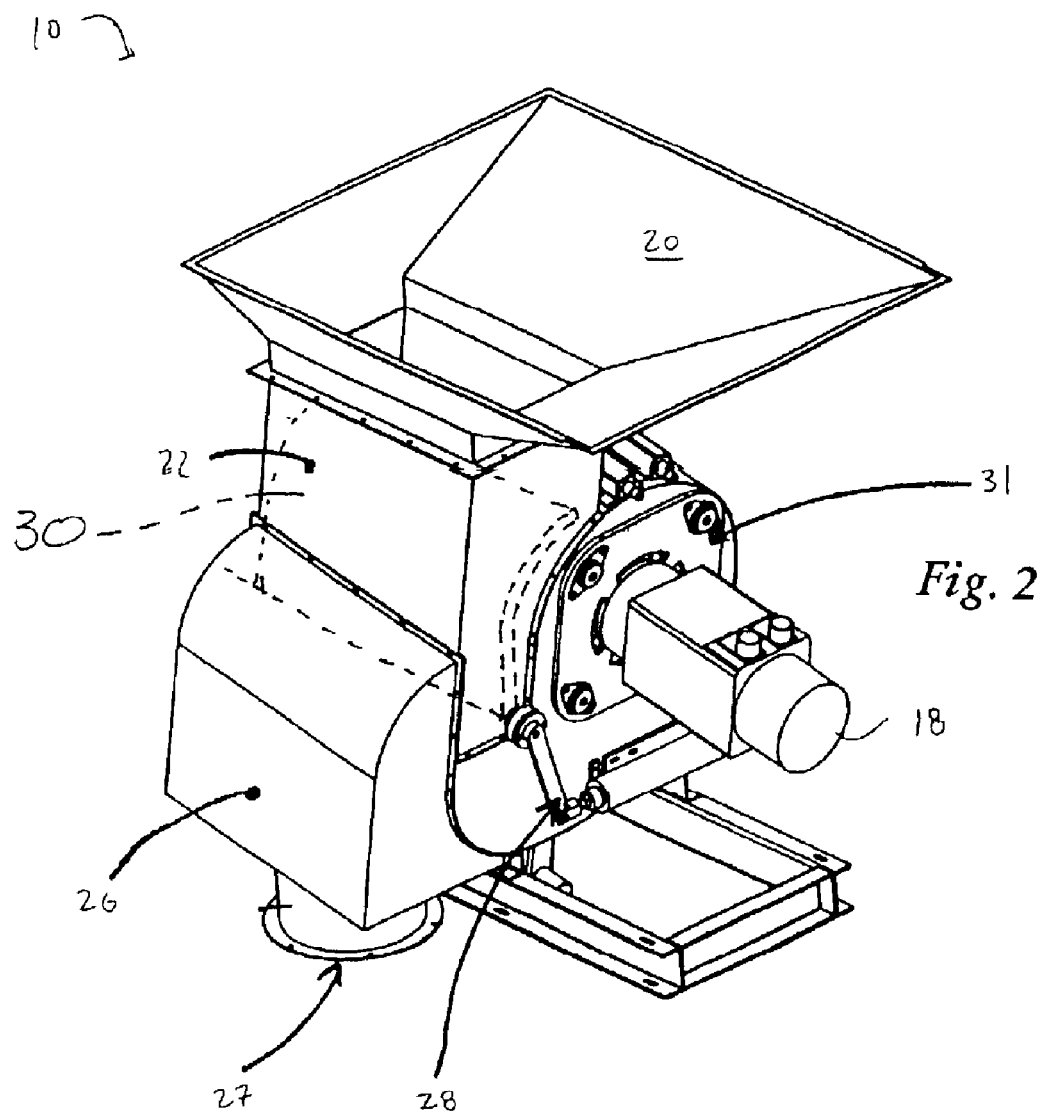
FIG. 2 is a back, top and right side perspective view of the centrifugal processor shown in FIG. 1.

Refening to FIG. 2, an intake gate actuator 28 is pivotally mounted to the rear, right side of the processor housing 12 and the rotor housing 14. The intake gate actuator 28 is coupled to an intake gate 30 (shown in FIGS. 4 and 5) that is contained within the processor housing 12. The drive suspension 31 is mounted to the rear of the housing 12 near the intake gate actuator 28. The motor 18 is mounted directly to the drive suspension 31. The intake gate 30 extends entirely across the width of the intake duct 22, as shown in dotted lines in FIG. 2. A fixed end plate 59 at the lower end of the inlet 20 tends to close off the bottom end of the inlet 20 from the bowl 24.

Figure 3:
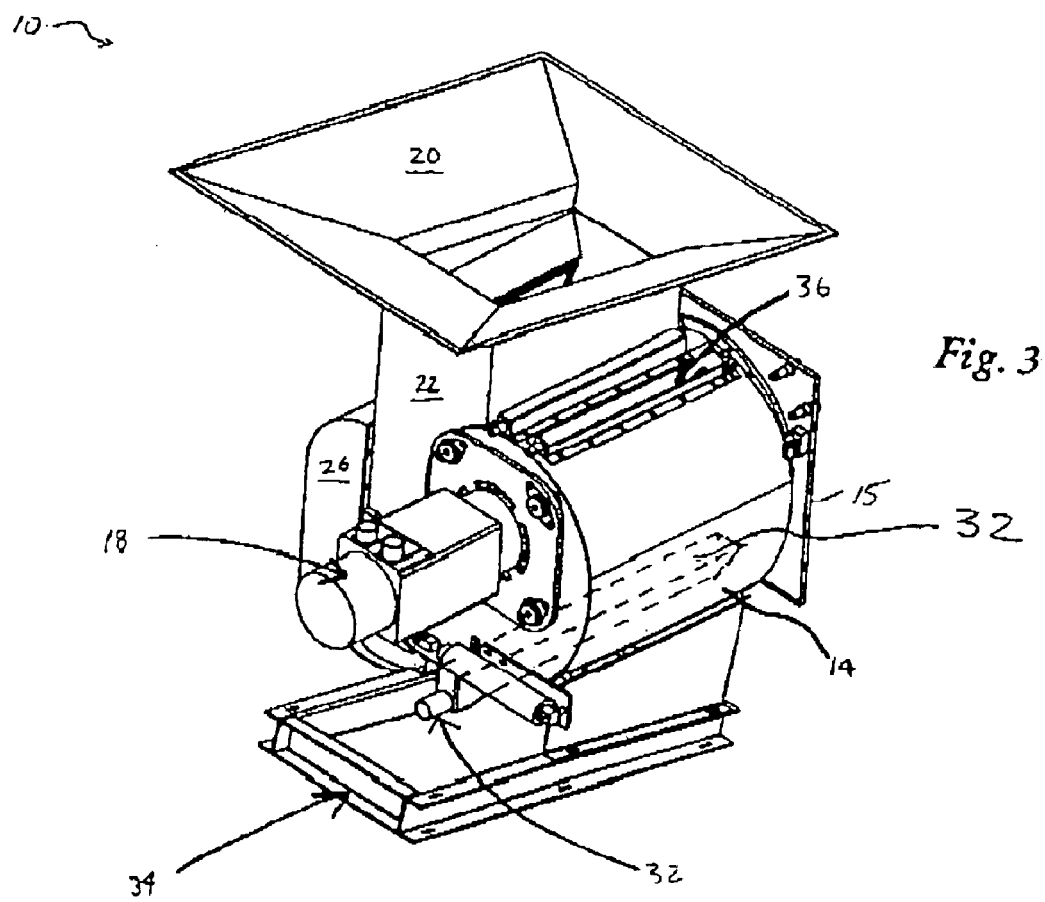
FIG. 3 is a back, top and left side perspective view of the centrifugal processor shown in FIG. 1.

As shown in FIG. 3, a drain 32 may extend directly from the bowl 24 at or about the rear of the processor housing 12 and almost directly beneath the drive suspension 31 and motor 18. The liquid drain preferably extends from the front to the back of the chamber 19, as shown in dotted lines in FIG. 3. This full length drain helps to quickly remove particle-containing processing fluid. In particular, the drain 32 minimizes the amount of fluid droplets going into the exhaust duct 26 and out the exhaust outlet 27. FIG. 3, as well as FIGS. 1, 2, 4, and 5, illustrates that the processor housing 12 may be mounted to a base 34. FIG. 3 also illustrates that spray manifolds 36 may be mounted to the topside of the rotor housing 14 for spraying deionized water, solvents, acids, gases, etc. The spray manifolds are connected to liquid or gas supplies 35, as is well known in the field.

Turning in detail to FIG. 4, a filter 38 (shown only in FIG. 4) is preferably mounted on top of the inlet 20. The filter 38, preferably an ultra low particle air (ULPA) of e.g., 0.12 micron filtration, filter particles out of the air entering the processing chamber 19. A heater 40, also shown only in FIG. 4, is preferably mounted above the filter 38. The heater 40 heats the air entering into the chamber, resulting in quicker drying times.

The rotor assembly 16 within the rotor housing 14 is rotatably positioned near the top wall of the rotor housing 14, with the spray manifolds 36 mounted almost directly above the rotor. The rotor assembly 16 includes a rotor 42, which is driven by the motor 18. Fan blades 45 extend from the outside diameter of the rotor 42 right up to the edge of the wafers 46 or other flat media held within a wafer carrier secured within the rotor. This continuous blade configuration, best illustrated in FIG. 7, advantageously helps effect a proper cross flow across the wafers 46.

Referring to FIG. 4, the intake gate 30 has a curved arm 48 with a wedge 50 extending inwardly toward the interior of the processing chamber 19. The wedge 50, preferably made of plastic, such as PTFE or PVDF extends from the end of the arm 48 at the lower end of the intake duct 22. The arm 48 and wedge 50 of the intake gate 30 pivot about a pivot axis 52 near the wedge 50. A curved retaining wall 54 helps prevent fluid droplets flung from the wafers 46 from moving back into the processing chamber 19 and undesirably redepositing onto the wafers 46.

Figure 5:
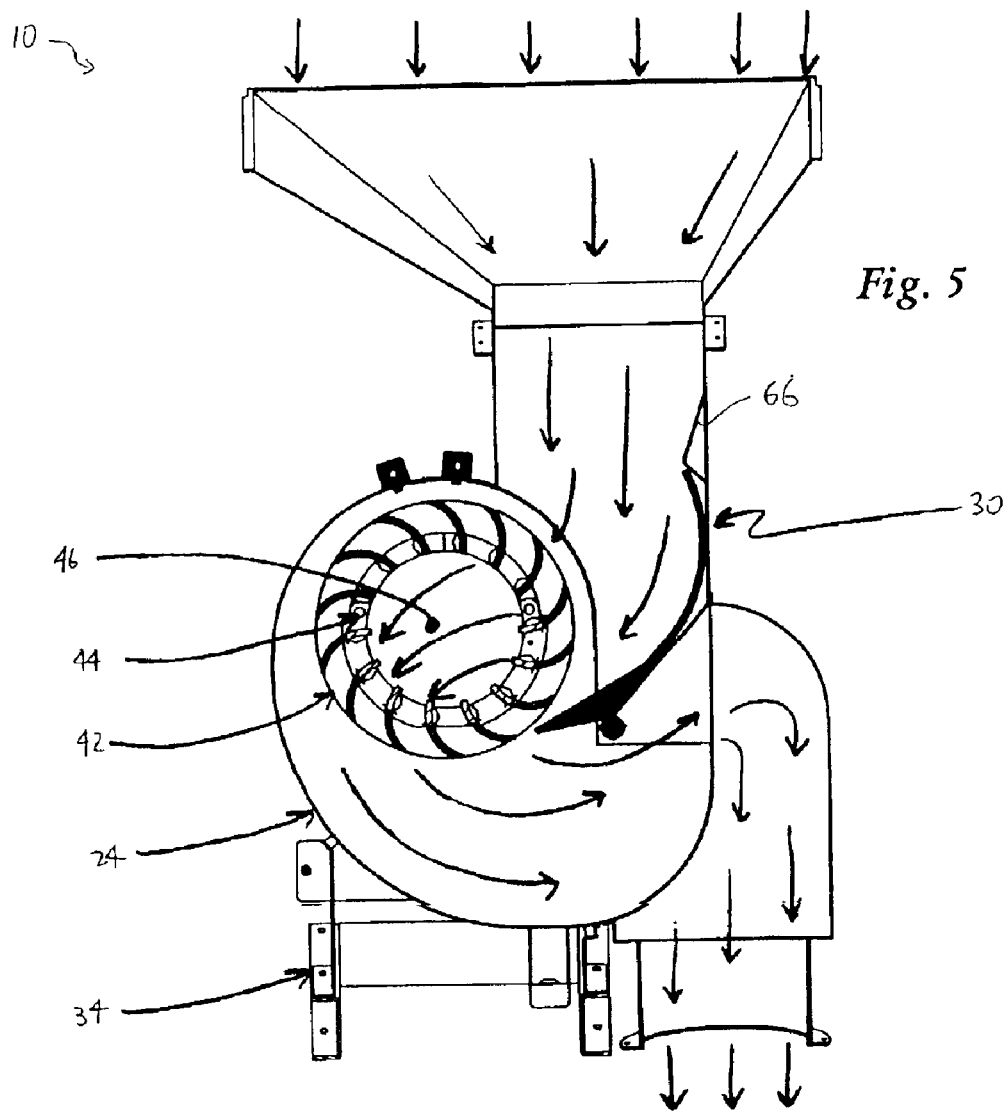
FIG. 5 is a front, partially sectional view of the centrifugal processor shown in FIG. 1 operating in the drying mode.

FIG. 4 illustrates the operation of the processor 10 in the rinse mode, whereas FIG. 5 illustrates the drying mode. Prior to a detailed discussion of the operation of the processor 10, the details of a preferred rotor assembly 16 are set forth.

Figure 6:
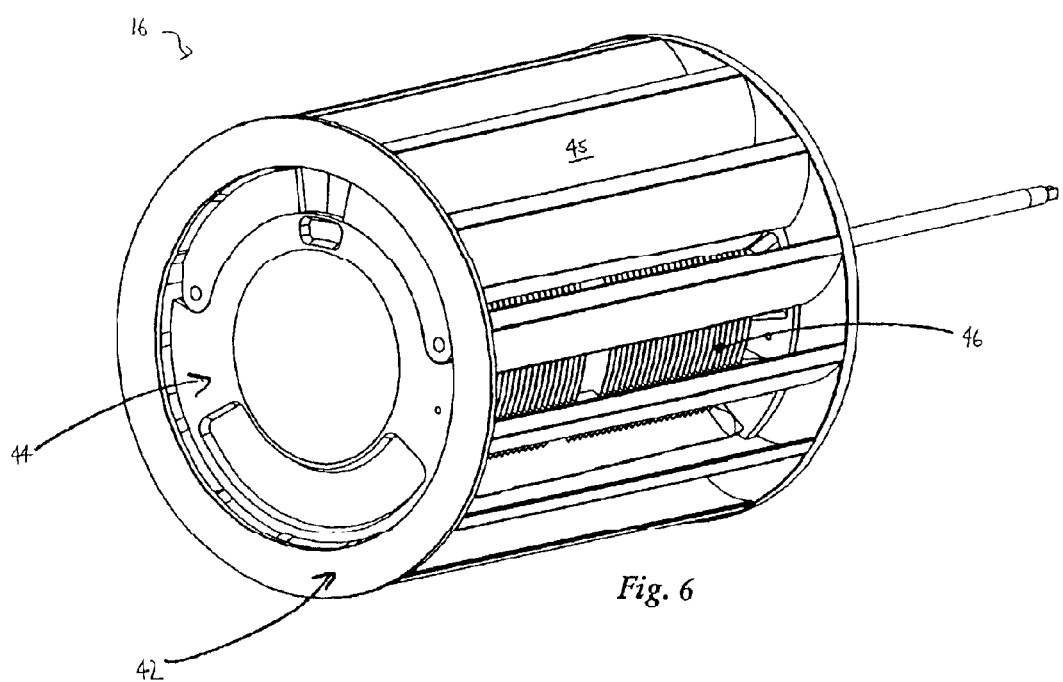
FIG. 6 is a detailed, front right perspective view of a rotor assembly that may be used in the present centrifugal processor.
Figure 7:
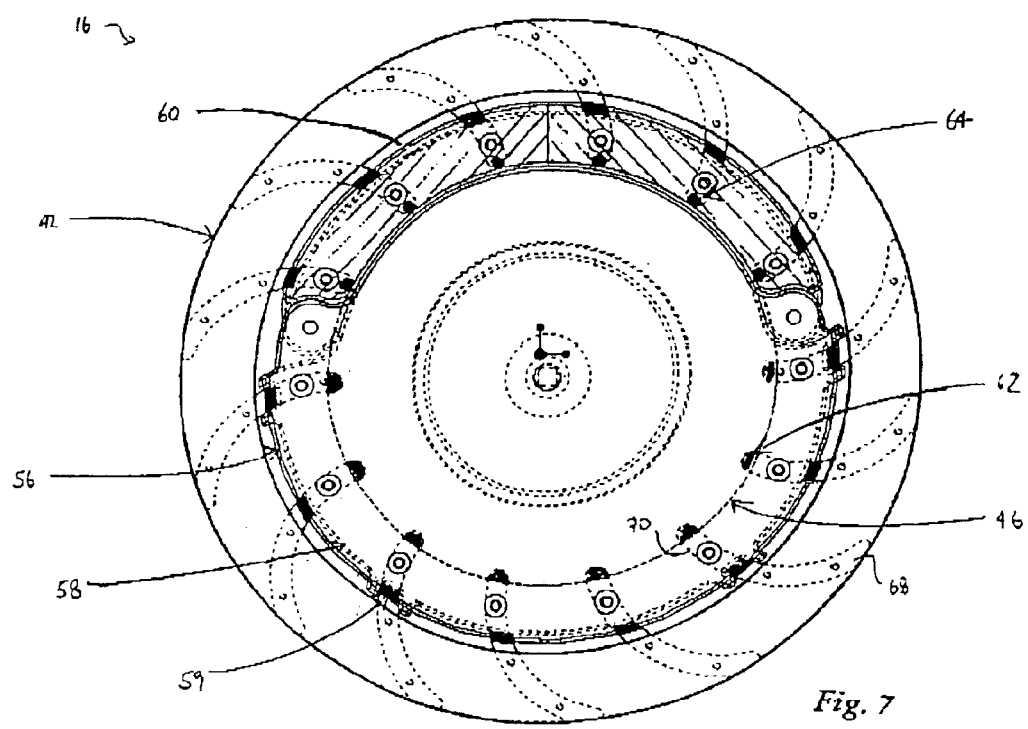
FIG. 7 is a front cross-sectional view of the rotor assembly shown in FIG. 6.

Referring to FIGS. 6 and 7, rotor assembly 16 is adapted to receive and hold a carrier 44, such as the carrier described in U.S. patent application Ser. No. 09/735,154, incorporated herein by reference. Alternatively, the rotor assembly 16 may include a comb rotor that has combs for holding the wafers 46 directly, rather than a cassette. The designs for holding wafers directly in combs in a rotor, or for holding a cassette carrying wafers in a rotor, are well known, as described, for example in U.S. Pat. Nos. 5,664,337 and 5,232,328, incorporated herein by reference.

The present rotor assembly 16 and particularly the carrier 44 is specifically designed to create wafer symmetry with regard to environment and processing fluids. In particular, the rotor assembly 16 includes a retainer 60 holding a carrier 44 having a carrier front rim 56, a carrier rear rim 58, and a stepped rail engagement 59. Each fan blade 45 preferably has one end 68 that extends from the outside diameter of the rotor 42, with the other end 70 of the fan blade 45 extending to the edge of the wafers 46. The ends 70 of each blade 45 may have teeth 62 extending therefrom about the lower half of the rotor 42. At about the upper half (or less) of the rotor 42, end 70 of each blade 45 may have an o-ring 64. The fan blades 45 are forwardly inclined towards the direction of rotation shown in FIG. 6. Consequently, the blades 45 scoop air into the rotor, as the rotor spins.

In use, the centrifugal processor 10 is installed in a clean room, typically along with other semiconductor manufacturing equipment. Air supplied to the clean room is filtered to remove particles that may interfere with the manufacturing processes. In the present processor 10, the air may be further filtered via filter 38 illustrated in FIG. 4.

The chamber door 15 is opened. A carrier 44 holding wafers 46 is placed into the rotor 42. If no carrier is used, the wafers 46 are then placed directly onto the combs of a comb rotor. The intake gate actuator 28 is then rotated upwardly to swing the intake gate 30 about the pivot axis 52 into the closed position, as shown in FIG. 4.

The motor 18 is then turned on and spins the rotor 42 containing the wafers 46. Liquids and/or gases are sprayed onto the wafers 46 by the spray manifolds 36, through the blades 45 on the spinning rotor 42. Additional manifolds may also be provided, to spray other fluids or gases. With the intake gate 30 in the closed position, the gate 30 advantageously allows the chamber 19 to be relatively isolated during the rinse cycle. This tends to prevent droplets from being flung back up into the intake duct 22. Due to the design of the bowl 24, arm 48, and wedge 50, the fluid droplets are allowed to accumulate at the bottom of the bowl 24. The fluid collects in the drain 32, as shown by the drainage D of the contaminated fluid droplets in FIG. 4, and is drained out.

FIG. 5 illustrates the operation of the processor 10 in the drying mode. After the wafers 46 have been sufficiently rinsed, the intake gate actuator 28 is rotated downwardly to swing the intake gate 30 into the open or drying position as shown in FIG. 5. Once opened, the rotor 42 is accelerated up to a drying speed of about 2,000 rpm. The spinning blades 45 draw heated and filtered air into the rotor housing 14 via the inlet 20 and intake duct 22. This quickly displaces and dries fluid droplets on the wafers 46. When pivoted about the pivot axis 52, the wedge 50, spaced about 0.5–2 cm from the rotor, helps to provide cross flow. Due in general to the eccentric shape of the bowl 24, the gate 30, and the wedge 50, the exhausting air is directed toward the exhaust duct 26 where it meets a retaining wall 54. Wall 54 retains the fluid, with the air then taking a U-turn down toward the exhaust outlet 27. This causes air borne contaminant particles to be carried out of the chamber 19, avoiding redeposition onto the wafers 46. As shown in FIG. 5, the inlet direction I and outlet direction O are preferably perpendicular.

The operation of the processor 10 as described above is preferably controlled automatically by a computer/controller 61 linked to and/or controlling spray valves, the motor, the gate actuator, the air heater and other components, sensors, indicators or operator interfaces.

A protrusion 66 may extend from the wall of the intake duct 22 to deflect incoming air onto the curved arm 48. Without the protrusion 66, incoming air may be trapped behind the arm 48 and the wall of the intake duct 22 due to the curvature of the arm 48 itself.

With the present centrifugal processor 10, the chamber 19 is designed to function like a cross flow fan. Large volumes of air are pumped across the surfaces of the wafers 46. The cross flow processing chamber 19 pumps air from one side of the fan or rotor assembly 16 through the center of the fan or rotor assembly 16 and forces the air to exit out the opposite side of the fan. Flow is normal to the axis of rotation and a vortex is created within the rotor assembly near the wedge as a result of the blades establishing flow. The rotor assembly 16, including the rotor 42, carrier 44, and wafers 46, acts like a cross flow fan. The bowl 24, intake gate 30, and ducting provides the geometry and boundaries for the processor 10 to function as a proper cross flow fan.

In use, the wafers 46 dry very quickly and efficiently by flowing large amounts of air uniformly across the wafer surfaces. In the processing chamber shown, air flow is approximately 500–600 standard cubic feet per minute (SCFM). Test data shows even higher flow rates reaching approximately 750–1200 SCFM. Such numbers are dramatically high when compared to 10–50 SCFM of air flow attributed to known centrifugal processors. These high air flow rates speed up drying. In contrast to the lower flow rates of known centrifugal processors, which have dry times of 6 to 7 minutes, the present processor has a drying time of approximately 30–60 seconds.

Since the flow path of the processing chamber 19 is in from the top, across the centerline, and out the bottom, the flow path is advantageously across the wafers 46 where it is needed and the wafers 46 are only exposed to the same air once. In other words, the air moves through the chamber once, without back eddies or stray air flow causing exiting air to move back into the chamber. Therefore, the wafers 46 can be dried quickly. Air borne particles are carried out the chamber exhaust duct 26 and exhaust outlet 27. This reduces the possibility of particles being redeposited onto wafers 46 from air flow that is recirculated within the chamber 19. Cost effective and increased yields are thus realized. Current known designs typically have minimal flow across the wafers 46 and air can be recirculated inside the chamber 19 before it exits, resulting in decreased yields due to contamination.

The present centrifugal processor 10 also achieves uniformity of flow compared to known designs. In particular, the flow out of the cross flow processing chamber 19 is very uniform along its length. The inlet 20 and intake duct 22, the drain 32, the exhaust duct 26 and the exhaust outlet 27 are full length so that uniform flow across each wafer 46 can be achieved. Moreover, the bowl 24 with its large opening and large bowl bottom does not restrict the uniformed flow, resulting in a better cross flow since cross flow fans function best via low pressure differentials. Finally, since filtered air is used instead of nitrogen to dry the wafers 46, the cost of ownership is dramatically reduced.

The processor 10 may be used as a standalone spin rinser dryer, spray solvent machine, spray acid machine or other centrifugal processor.

Figure 8:
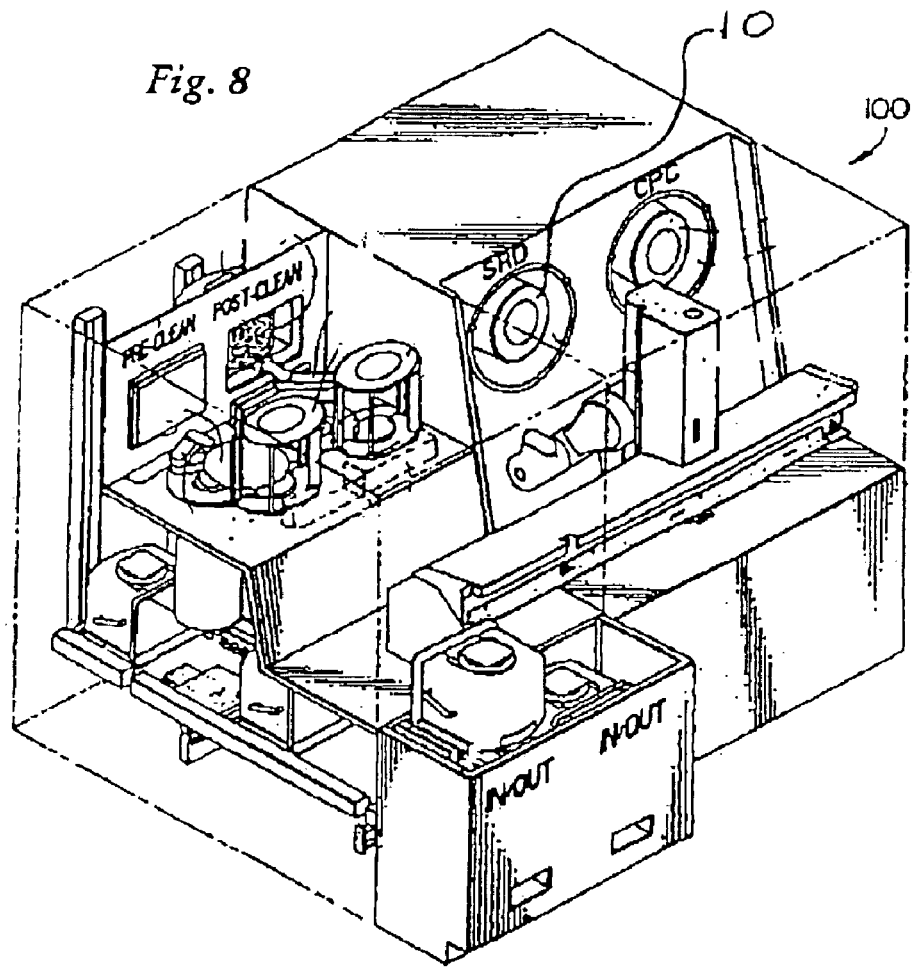
FIG. 8 is a perspective view of the centrifugal processor of FIG. 1 as used in an automated processing system.
Figure 9:
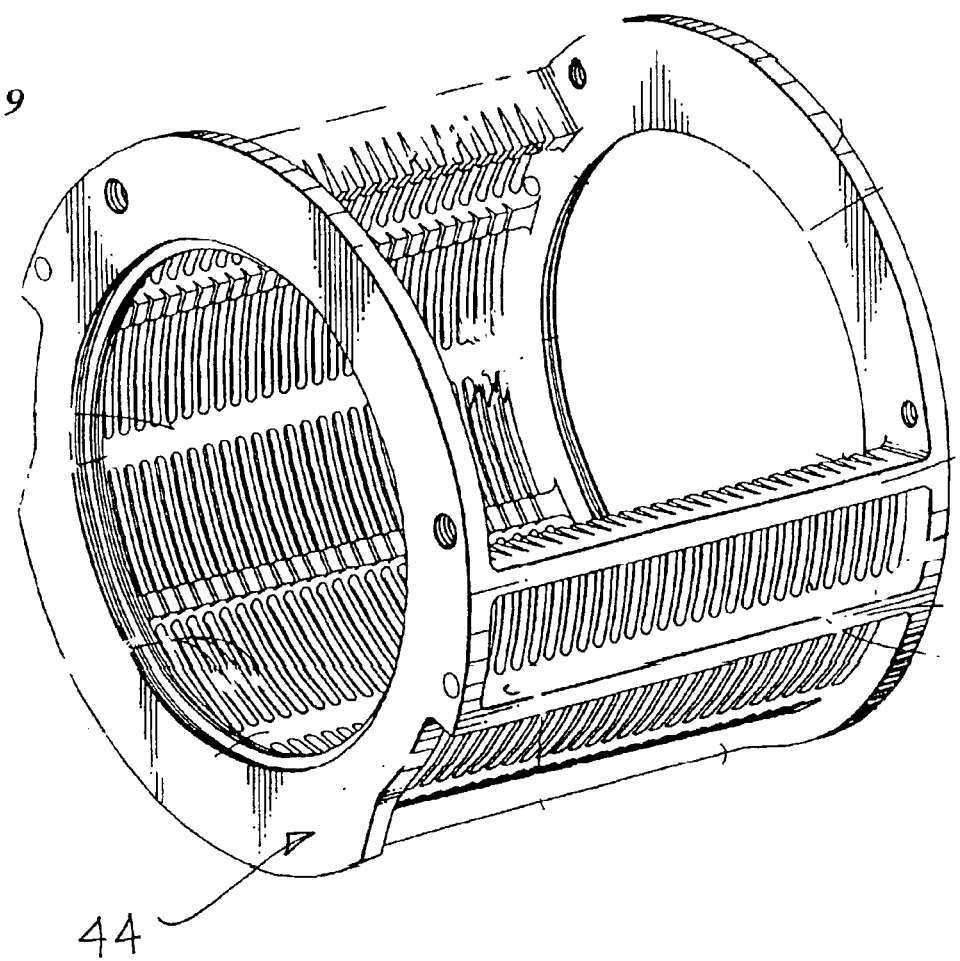
FIG. 9 is a perspective view of the carrier shown in FIG. 6.

As shown in FIG. 8, the processor 10 may also be used in an automated system 100, for example, as described in U.S. patent application Ser. No. 09/612,009, incorporated herein by reference.

Thus, a novel cross flow centrifugal processor has been shown and described. Various modifications may of course be made without departing from the spirit and scope of the invention. The invention, therefore, should not be limited, except to the following claims and their equivalents.

What is claimed is:

1. A cross flow centrifugal processor comprising:
   an elongated inlet for receiving incoming fluid;
   a rotor housing defining a process chamber in fluid communication with the inlet;
   an elongated outlet in fluid communication with the rotor housing;
   a rotor rotatably disposed within the chamber and adapted to hold flat media;
   a wedge disposed proximate the rotor wherein rotation of the rotor creates air flow through the inlet, into the chamber and across the flat media, and out the outlet such that the flat media is exposed to the same incoming fluid only once.

2. The centrifugal processor of claim 1 wherein the process chamber is designed to flow between about 500–1200 standard cubic feet per minute.

3. The centrifugal processor of claim 1 wherein the wedge is coupled to a curved arm that is pivotably mounted to the rotor housing.

4. The centrifugal processor of claim 3 wherein the arm is adapted to pivot to a closed position for isolating the chamber from the inlet when the processor is in a rinse mode.

5. The centrifugal processor of claim 1 further including a curved retaining wall at the outlet for accumulating fluid after the incoming fluid exits the chamber.

6. The centrifugal processor of claim 1 further comprising a filter and a heater each disposed about the inlet.

7. The centrifugal processor of claim 1 further comprising a drain in fluid communication with the chamber.

8. The centrifugal processor of claim 1 wherein the rotor has fan blades disposed about the flat media.

9. A centrifugal processor comprising:
   an inlet;
   a rotor housing in fluid communication with the inlet;
   a rotor having fan blades extending from an outer diameter of the rotor to wafers contained within the rotor, the rotor disposed within the rotor housing;
   an intake gate for isolating the rotor housing from the inlet; and
   an outlet in fluid communication with the rotor housing.

10. A centrifugal processor comprising:
    a rotor housing having an eccentric bowl;
    a rotor contained within the rotor housing and adapted to hold flat media;
    an intake gate pivotably mounted to the rotor housing for pivoting the gate into first and second positions about the rotor, the intake gate having a first end including a wedge, and an opposing second end, the first end pivoted toward the rotor in the first position, the first end pivoted away from the rotor in the second position.

11. The centrifugal processor of claim 10 wherein the wedge is pivotable to within 0.5–2 cm of the rotor.

12. The centrifugal processor of claim 10 wherein the rotor includes fan blades extending from the outer diameter of the rotor to the flat media.

13. The centrifugal processor of claim 10 further comprising a drain in fluid communication with the bowl.

14. The centrifugal processor of claim 10 further comprising an inlet and an outlet in fluid communication with the rotor housing, and a filter disposed above the inlet.

15. The centrifugal processor of claim 14 further comprising a heater disposed above the filter.

16. The centrifugal processor of claim 10 further comprising an elongated inlet and an elongated outlet in fluid communication with the rotor housing for creating a cross flow path across the flat media such that the flat media is exposed to incoming air entering through the inlet only once.

17. An apparatus for processing semiconductor wafers, comprising:
    a rotor housing having an air inlet and an air outlet;
    a rotor in the rotor housing with the rotor having fan blades and with the rotor adapted to receive and hold the wafers; and
    an intake gate movable to substantially close off the rotor housing from the inlet.

18. The centrifugal processor of claim 17 wherein the intake gate is pivotably mounted to the rotor housing.

19. The centrifugal processor of claim 17 wherein the intake gate includes an arm and a wedge at one end of the arm.

20. The centrifugal processor of claim 17 wherein the intake gate is adapted to pivot to an open position for drying wafers contained within the rotor housing and to a closed position for rinsing wafers contained within the rotor housing.

21. The centrifugal processor of claim 20 wherein the wedge of the intake gate is pivoted to the edge of the rotor housing when the intake gate is in the closed position.

22. The centrifugal processor of claim 17 wherein the eccentric bowl disposed substantially between the rotor and the outlet.

23. The centrifugal processor of claim 22 further comprising a drain in fluid communication with the bowl.

24. The centrifugal processor of claim 17 further comprising a protrusion in the intake duct adapted to deflect incoming air onto the intake gate.

25. The centrifugal processor of claim 17 further comprising a filter disposed above the intake duct.

26. The centrifugal processor of claim 17 further comprising a heater disposed about the intake duct.

27. The centrifugal processor of claim 17 wherein the inlet, rotor housing, intake gate, and outlet are adapted to create a cross flow path across wafers contained within the rotor housing such that the wafers are exposed to incoming air only once.

28. The processor of claim 17 with the rotor comprising combs for holding the wafers.

29. The processor of claim 17 with the rotor adapted to hold a carrier containing the wafers.

30. The processor of claim 17 with substantially all of the fan blades extending generally radially inwardly from an outer diameter of the rotor, to a position adjacent to the wafers.

31. A centrifugal semiconductor wafer processor, comprising:
    a housing having an eccentric bowl and an inlet and an outlet;
    a rotor rotatably supported within the housing, with the rotor having an open central area adapted for holding a batch of wafers, and with the rotor having a plurality of blades around the open central area;
    at least one spray manifold in the housing, for spraying a process liquid or gas onto the wafers within the rotor;
    a drain in housing; and
    a gate moveable to substantially close off air flow through the housing.

32. A centrifugal semiconductor wafer processor, comprising:
    a housing having an inlet and an outlet;
    a rotor rotatably supported within the housing, with the rotor having a plurality of fan blades;
    a wafer carrier within the rotor and holding a batch of wafers;
    at least one spray manifold in the housing, for spraying a process liquid or gas onto the wafers within the rotor; and
    a gate moveable from an open position, wherein air flows generally freely through the housing, to a closed position, wherein the gate substantially prevents from entering into the housing through the inlet.

* * * * *